(12) United States Patent
Yang et al.

(10) Patent No.: US 8,725,929 B1
(45) Date of Patent: *May 13, 2014

(54) ADAPTIVE READ AND WRITE SYSTEMS AND METHODS FOR MEMORY CELLS

(75) Inventors: Xueshi Yang, Cupertino, CA (US);
Zining Wu, Los Altos, CA (US);
Gregory Burd, San Jose, CA (US)

(73) Assignee: Marvell World Trade Ltd., St. Michael (BB)

(*) Notice: Subject to any disclaimer, the term of this patent is extended or adjusted under 35 U.S.C. 154(b) by 1006 days.

This patent is subject to a terminal disclaimer.

(21) Appl. No.: 12/350,068

(22) Filed: Jan. 7, 2009

Related U.S. Application Data

(63) Continuation-in-part of application No. 11/932,829, filed on Oct. 31, 2007, now Pat. No. 7,941,590.

(60) Provisional application No. 60/864,468, filed on Nov. 6, 2006, provisional application No. 60/910,325, filed on Apr. 5, 2007.

(51) Int. Cl.
*G06F 12/00* (2006.01)
*G06F 13/00* (2006.01)
*G06F 13/28* (2006.01)

(52) U.S. Cl.
USPC .................................. 711/103; 711/E12.001

(58) Field of Classification Search
USPC .......................................... 711/103, E12.001
See application file for complete search history.

(56) References Cited

U.S. PATENT DOCUMENTS

| | | | |
|---|---|---|---|
| 4,041,456 A | 8/1977 | Ott et al. | |
| 5,414,734 A * | 5/1995 | Marchetto et al. | ............ 375/267 |
| 5,734,612 A | 3/1998 | Yoshikawa | |
| 5,751,635 A | 5/1998 | Wong et al. | |
| 5,825,243 A | 10/1998 | Sato et al. | |
| 6,115,285 A | 9/2000 | Montanari et al. | |
| 6,224,553 B1 * | 5/2001 | Nevo | ............................. 600/437 |
| 6,519,264 B1 * | 2/2003 | Carr et al. | ..................... 370/449 |
| 6,538,922 B1 | 3/2003 | Khalid et al. | |
| 6,674,900 B1 | 1/2004 | Ma et al. | |
| 6,678,192 B2 | 1/2004 | Gongwer et al. | |
| 7,116,597 B1 | 10/2006 | Goldman et al. | |
| 7,941,590 B2 | 5/2011 | Yang et al. | |
| 2002/0196510 A1 | 12/2002 | Hietala et al. | |
| 2004/0027958 A1 | 2/2004 | Takeuchi et al. | |

(Continued)

FOREIGN PATENT DOCUMENTS

| | | |
|---|---|---|
| KR | 20000016640 | 3/2000 |
| KR | 20030043976 | 6/2003 |

(Continued)

*Primary Examiner* — Sheng-Jen Tsai

(57) ABSTRACT

Adaptive memory read and write systems and methods are provided that may compute estimated means and variances of multi-level memory cells to facilitate writing and reading of data to and from the multi-level memory cells are described herein. The systems may include an apparatus comprising multi-level memory cells, and an estimation block configured to compute estimated means and variances of level distributions of the multi-level memory cells by processing signal samples provided by at least a subset of the multi-level memory cells, the estimated means and variances to be used to facilitate writing and/or reading of data to and/or from at least selected ones of the multi-level memory cells, the multi-level memory cells having M-levels where M is an integer greater than 1, and each of the level distributions is associated with a corresponding level of the M-levels.

20 Claims, 9 Drawing Sheets

(56) References Cited

U.S. PATENT DOCUMENTS

| | | |
|---|---|---|
| 2006/0142988 A1* | 6/2006 | Akiyama et al. ............... 703/14 |
| 2006/0161831 A1* | 7/2006 | Mehalel ...................... 714/758 |
| 2007/0076464 A1 | 4/2007 | Koebernick et al. |
| 2007/0245214 A1 | 10/2007 | Ramamoorthy |
| 2008/0092026 A1 | 4/2008 | Brandman et al. |
| 2008/0291724 A1 | 11/2008 | Litsyn et al. |
| 2009/0003073 A1 | 1/2009 | Rizel et al. |
| 2010/0131826 A1* | 5/2010 | Shalvi et al. ................ 714/763 |

FOREIGN PATENT DOCUMENTS

| | | |
|---|---|---|
| WO | WO 97/48099 | 12/1997 |
| WO | WO 02/27729 | 4/2002 |
| WO | WO 02/27729 A | 4/2002 |

* cited by examiner

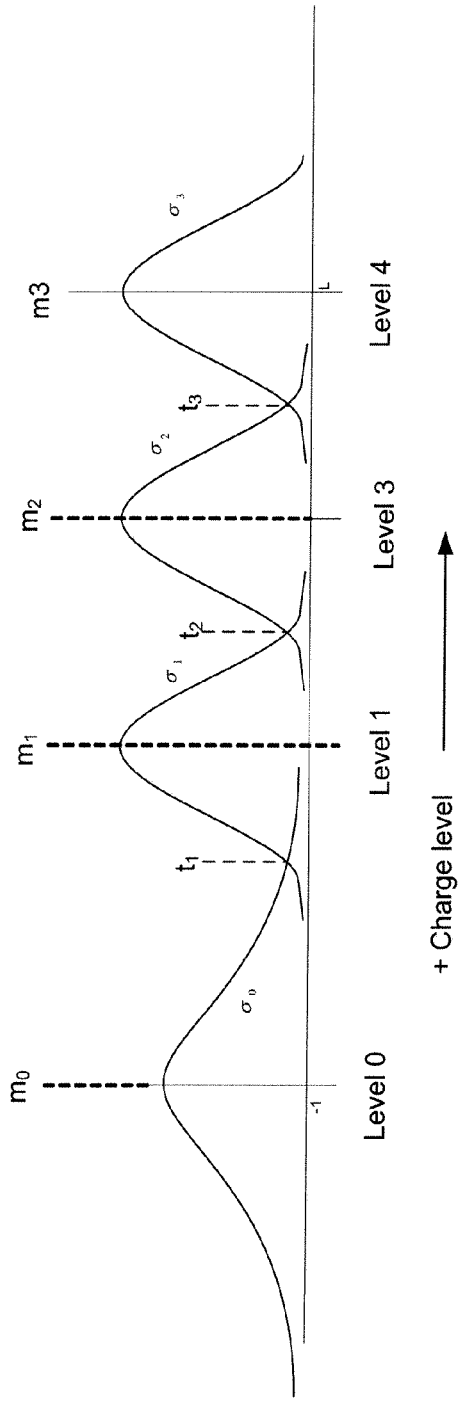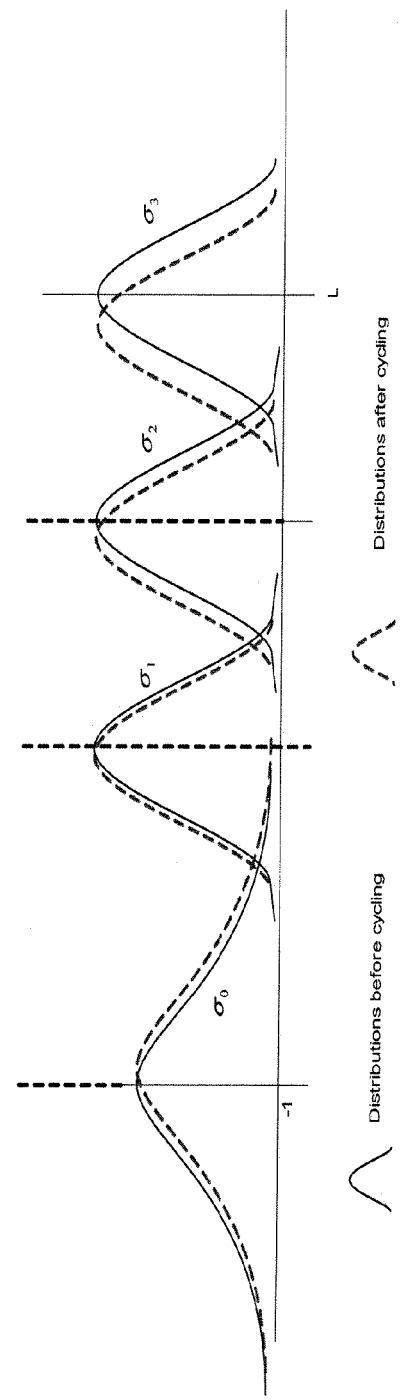

| Block Index $^{41}$ | Estimated mean value $^{42}$ | Estimated standard deviations $^{43}$ | Near optimal or optimal mean values $^{44}$ | Near optimal or optimal detection thresholds $^{45}$ |
|---|---|---|---|---|
| 0 | $m_0, m_1, \ldots$ | $\sigma_0, \sigma_1, \ldots$ | $\tilde{m}_0, \tilde{m}_1, \ldots$ | $t_1, t_2, \ldots$ |
| 1 | | | | |
| 2 | | | | |
| 3 | | | | |
| ... | | | | |

US 8,725,929 B1

ADAPTIVE READ AND WRITE SYSTEMS AND METHODS FOR MEMORY CELLS

CROSS-REFERENCES TO RELATED APPLICATIONS

This application is a continuation-in-part application of co-pending U.S. patent application Ser. No. 11/932,829 entitled "ADAPTIVE READ AND WRITE SYSTEMS AND METHODS FOR MEMORY CELLS," filed on Oct. 31, 2007, which claims priority to U.S. Patent Application No. 60/864,468, filed Nov. 6, 2006, entitled "Adaptive Read and Write Systems and Methods for Flash Memory," and U.S. Patent Application No. 60/910,325, filed Apr. 5, 2007, entitled "Parameter Estimation for NV Memory,". The specifications of said applications are hereby incorporated by reference in its entirety for all purposes except for those sections, if any, that are inconsistent with the present specification.

TECHNICAL FIELD

Embodiments of the present invention relate to the field of data memory devices, and more particularly, to storage and retrieval of data to and from memory cells.

BACKGROUND

Memory cells, such as flash memory cells, may store data by trapping granulized amounts of charge in, for example, an isolated region of a transistor. In such devices, data retrieval from a memory cell is typically made possible by applying a read voltage to the transistor and subsequently estimating the readout current which is determined by the amount of charge trapped in the cell.

An example of a basic type of memory cell is one that may store 1-bit of information. In such a memory cell, the memory cell may hold or not hold a charge to indicate, for example, logic 0 when a charge is stored, and to indicate logic 1, when no charge is stored.

In contrast, "multi-level memory cells" may be able to store more than 1-bit of information by taking advantage of the ability of such memory cells to hold varying amounts of charge or charge levels. For example, suppose the maximum number of trapped charge allowed in a multi-level memory cell is Q. It may then be possible to store more than 1 bit of information in such a cell by storing a granulized amount of charge between 0 and Q, and subsequently estimating the amount of charge stored during readout of the cell. Thus, for example, 2 bits of information may be stored in one multi-level memory cell by trapping any one of, for example, four levels of charges: 0, Q/3, 2Q/3, Q. This process of trapping charges may be referred to as programming.

In practice, it is often difficult to precisely program a multi-level memory cell with a desired amount of charges. Indeed, the actual programmed amount of charges approximately follows a Gaussian distribution centered on a desired charge level. The variance of the distribution may be determined by the programming method as well as the physical properties of the memory cell. Consequently, the threshold voltage distributions of flash memory cells are also Gaussian.

FIG. 1 illustrates four threshold voltage distributions (herein "level distributions") for a 2-bit memory cell. The four level distributions depicted are associated with four different levels of charge that may be stored in a memory cell, each level distribution having its own mean and variance. As depicted in FIG. 1, the intersections of the four charge levels (level 0, level 1, level 2, and level 3) define three detection thresholds (t1, t2, and t3) That is, the three detection thresholds (t1, t2, and t3) are located where curves of two adjacent level distributions intersect.

In order to properly write and read data to and from a multi-level memory cell, two things should be known: the detection thresholds and the means of the level distributions of the multi-level memory cell. In particular, the detection thresholds (e.g., t1, t2, and t3) may be needed in order to read data from the memory cells, and the means (e.g., m1, m2, m3, and m4) of the level distributions may be needed in order to write data to the memory cell. That is, the detection thresholds are needed during a read operation of a multi-level memory cell in order to determine whether the charge stored in the memory cell is at level 0, level 1, level 2, or level 3. In contrast, the means of the level distributions are needed during a write operation of a multi-level memory cell in order to more accurately target the amount of charge to be programmed into the memory cell.

For example, in order to determine whether the total charge stored in a multi-level memory cell is in level 0 during a read operation, the value of the first detection threshold (t1) should be known. By knowing the value of t1, one would simply determine whether the charge stored (or not stored since level 0 could be zero charge) in the memory cell is less than t1 in order to determine whether the stored charge is at level 0. Similarly, in order to determine whether the charge stored in the memory cell is at level 1, you would determine whether the charge stored in the memory cell is between t1 and t2.

In contrast, in order to target the right amount of charge to program into a multi-level memory cell during a write operation, the means (herein "mean values") of the level distribution should be known. For example, referring back to FIG. 1, if one wanted to store level 2 amount of charge in the memory cell, one would need to know the second mean value (m1) in order to properly program the memory cell. By targeting m1 amount of charge to be stored in the memory cell, error may be minimized since m1 is located at the top of the Gaussian curve.

Unfortunately, memory cells, such as the multi-level flash memory cells described above, may be subject to retention loss after undergoing read and/or write cycling. As a result, the mean and variance of the level distributions change after cycling (e.g., read and write operations) as illustrated FIG. 2. In order to account for the degradation of such memory cells and to minimize error during read and write operations of such memory cells, memory read/write systems need to track not only the changes to the level distributions, but also to adaptively adjust the read and write processes to mitigate the detrimental effects of repeated cycling operations.

SUMMARY

According to various embodiments of the present invention, adaptive memory read and write systems and methods are provided that may compute estimated means and variances of multi-level memory cells to facilitate writing and reading of data to and from the multi-level memory cells. The systems may include an apparatus comprising multi-level memory cells, and an estimation block configured to compute estimated means and variances of level distributions of the multi-level memory cells by processing signal samples provided by at least a subset of the multi-level memory cells, the estimated means and variances to be used to facilitate writing and/or reading of data to and/or from at least selected ones of the multi-level memory cells, the multi-level memory cells having M-levels where M is an integer greater than 1, and each of the level distributions is associated with a corresponding level of the M-levels.

In some embodiments, the multi-level memory cells may include pilot cells having predetermined data, and the estimation block may be configured to process signal samples provided by the pilot cells to compute the estimated means and variances of the level distributions of the multi-level memory cells. For these embodiments, the estimation block may be further configured to compute estimated means for each of the level distributions of the multi-level memory cells based, at least in part, on signal samples provided by the pilot cells, each of the estimated means computed according to the equations:

$$e_k' = r_k - m_{k-1}(i)$$

$$m_k(i) = m_{k-1}(i) + \mu_m \cdot e_k'$$

where for $0 \leq i \leq M-1$ and k is an integer greater than 0, $r_k$ is a k-th signal sample from one of the pilot cells, $m_{k-1}(i)$ is an estimated mean of i-th level distribution for time k−1, $e_k'$ is an initial estimated error for time k, $m_{k-1}(i)$ is an estimated mean of i-th level distribution for time k−1, and $\mu_m$ is a first adaptation constant.

In some embodiments, the estimation block may be further configured to compute estimated variances for each of the level distributions of the multi-level memory cells based, at least in part, on signal samples provided by the pilot cells, each of the estimated variances computed according to the equations:

$$e_k = r_k - m_k(i)$$

$$\sigma_k^2(i) = \sigma_{k-1}^2(i) + \mu_v(e_k \cdot e_k - \sigma_{k-1}^2(i))$$

where $e_k$ is a refined estimated error for time k based, at least in part, on the initial estimated error $e_k'$, $\sigma_k^2(i)$ is an estimated variance of i-th level distribution for time k, $\sigma_{k-1}^2(i)$ is an estimated variance of i-th level distribution for time k−1, and $\mu_v$ is a second adaptation constant.

In some embodiments, the estimation block may be further configured to set initial means and variances for each of the level distributions with predetermined default values prior to computing the estimated means and variances for each of the level distributions. For these embodiments, the estimation block may also be configured to compute M−1 slicer thresholds for the multi-level memory cells, each of the slicer thresholds computed according to the equation:

$$s(w) = m(w) + \frac{\sigma(w)}{\sigma(w) + \sigma(w+1)}[m(w+1) - m(w)]$$

where for $0 \leq w \leq M-2$, s(w) is an w-th slicer threshold, m(w) is an estimated mean for the w-th level distribution, σ(w) is a standard deviation for the w-th level distribution, σ(w+1) is a standard deviation for the (w+1)-th level distribution, and m(w+1) is an estimated mean for the (w+1)-th level distribution.

In some embodiments, the multi-level memory cells may include multi-level data memory cells to store user data, and the estimation block may be further configured to process signal samples provided by the multi-level data memory cells to facilitate the computation of the estimated means and variances of the level distributions of the multi-level memory cells. In some embodiments, the estimation block may be further configured to employ a binary tree to determine which of the M-levels perform each of the signal samples belong to, the computed slicer thresholds defining, at least in part, the binary tree.

In some embodiments, the estimation block may be further configured to recomputed the estimated means and variances of the level distributions of the multi-level memory cells based on the signal samples provided by the multi-level data memory cells and according to the equations:

$$e_k' = r_k' - m_{k-1}(i)$$

$$m_k(i) = m_{k-1}(i) + \mu_m' \cdot e_k'$$

$$\sigma_k^2(i) = \sigma_{k-1}^2(i) + \mu_v'(e_k' \cdot e_k' - \sigma_{k-1}^2(i))$$

where for $0 \leq i \leq M-1$ and k is an integer greater than 0, $r_k'$ is a k-th signal sample from one of the multi-level data memory cells, $m_{k-1}(i)$ is an estimated mean of i-th level distribution for time k−1, $e_k'$ is an estimated error for time k, $m_k(i)$ is an estimated mean of i-th level distribution for time k, $m_{k-1}(i)$ is an estimated mean of i-th level distribution for time k−1, and $\mu_m'$ is a third adaptation constant, $\sigma_k^2(i)$ is an estimated variance of i-th level distribution for time k, $\sigma_{k-1}^2(i)$ is an estimated variance of i-th level distribution for time k−1, and $\mu_v'$ is a fourth adaptation constant.

For these embodiments, the first adaptation constant $\mu_m$ and the second adaptation constant $\mu_v$ may be greater than the third adaptation constant $\mu_m'$ and the fourth adaptation constant $\mu_v'$, respectively.

In some embodiments, the estimation block may be configured to set initial means and variances for each of the level distributions with predetermined default values and to compute M−1 initial slicer thresholds for the multi-level memory cells prior to computing the estimated means and variances for each of the level distributions. For these embodiments, the estimation block may be further configured to compute the initial slicer thresholds in accordance with the equation:

$$s'(w) = m'(w) + \frac{\sigma'(w)}{\sigma'(w) + \sigma'(w+1)}[m'(w+1) - m'(w)]$$

where for $0 \leq w \leq M-2$, s'(w) is an w-th initial slicer threshold, m'(w) is the initial mean for the w-th level distribution, σ'(w) is an initial standard deviation for the w-th level distribution that is equal to square root of the initial variance for the w-th level distribution, σ'(w+1) is an initial standard deviation for the (w+1)-th level distribution that is equal to the square root of the initial variance for the (w+1)-th level distribution, and m'(w+1) is the initial mean for the (w+1)-th level distribution.

For these embodiments, the memory cells may include multi-level data memory cells to store user data, and the estimation block is further configured to process signal samples provided by the multi-level data memory cells to facilitate the determination of the estimated means and standard deviations of the level distributions of the multi-level memory cells. In some of these embodiments, the estimation block may be further configured to employ a binary tree to determine which of the M-levels perform each of the signal samples belong to, the computed initial slicer thresholds defining, at least in part, the binary tree.

In some embodiments, the estimation block may be further configured to compute the estimated means and variances of the level distributions of the multi-level memory cells based on the signal samples provided by the multi-level data memory cells and according to the equations:

$$e'_k = r'_k - m_{k-1}(i)$$
$$m_k(i) = m_{k-1}(i) + \mu'_m \cdot e'_k$$
$$\sigma_k^2(i) = \sigma_{k-1}^2(i) + \mu'_v(e'_k \cdot e'_k - \sigma_{k-1}^2(i))$$

where for $0 \leq i \leq M-1$ and k is an integer greater than 0, $r_k'$ is a k-th signal sample from one of the multi-level data memory cells, $m_{k-1}(i)$ is an estimated mean of i-th level distribution for time k−1, $e_k'$ is an estimated error for time k, $m_k(i)$ is an estimated mean of i-th level distribution for time k, $m_{k-1}(i)$ is an estimated mean of i-th level distribution for time k−1, and $\mu_m'$ is a first adaptation constant, $\sigma_k^2(i)$ is an estimated variance of i-th level distribution for time k, $$\sigma_{k-1}^2(i)$$

is an estimated variance of i-th level distribution for time k−1, and $\mu_v'$ is a second adaptation constant.

According to various embodiments, a method is provided that comprises receiving signal samples from at least a subset of multi-level memory cells, and computing estimated means and variances of level distributions of the multi-level memory cells by processing the signal samples, the estimated means and variances to be used to facilitate writing and/or reading of data to and/or from at least selected ones of the multi-level memory cells, the multi-level memory cells having M-levels where M being an integer greater than 1, and each of the level distributions is associated with a corresponding level of the M-levels. For these embodiments, the multi-level memory cells may include pilot cells having predetermined data, and the computing includes computing the estimated means and variances of the level distributions of the multi-level memory cells by processing signal samples received from the pilot cells.

In some embodiments, the computing of the estimated means include computing estimated means for each of the level distributions of the multi-level memory cells based, at least in part, on signal samples provided by the pilot cells, each of the estimated means computed according to the equations:

$$e'_k = r_k - m_{k-1}(i)$$
$$m_k(i) = m_{k-1}(i) + \mu_m \cdot e'_k$$

where for $0 \leq i \leq M-1$ and k is an integer greater than 0, $r_k$ is a k-th signal sample from one of the pilot cells, $m_{k-1}(i)$ is an estimated mean of i-th level distribution for time k−1, $e_k'$ is an initial estimated error for time k, $m_{k-1}(i)$ is an estimated mean of i-th level distribution for time k−1, and $\mu_m$ is a first adaptation constant.

In some embodiments, computing the estimated variances include computing estimated variances for each of the level distributions of the multi-level memory cells based, at least in part, on signal samples provided by the pilot cells, each of the estimated variances computed according to the equations:

$$e_k = r_k - m(i)$$
$$\sigma_k^2(i) = \sigma_{k-1}^2(i) + \mu_v(e_k \cdot e_k - \sigma_{k-1}^2(i))$$

where $e_k$ is a refined estimated error for time k based, at least in part, on the initial estimated error $e_k'$, $$\sigma_k^2(i)$$

is an estimated variance of i-th level distribution for time k, $$\sigma_{k-1}^2(i)$$

is an estimated variance of i-th level distribution for time k−1, and $\mu_v$ is a second adaptation constant.

In some embodiments, the method may further include setting initial means and variances for each of the level distributions with predetermined default values prior to computing the estimated means and variances for each of the level distributions. For these embodiments, the method may also include computing M−1 slicer thresholds for the multi-level memory cells, each of the slicer thresholds computed according to the equation:

$$s(w) = m(w) + \frac{\sigma(w)}{\sigma(w) + \sigma(w+1)}[m(w+1) - m(w)]$$

where for $0 \leq w \leq M-2$, s(w) is an w-th slicer threshold, m(w) is an estimated mean for the w-th level distribution, σ(w) is a standard deviation for the w-th level distribution, σ(w+1) is a standard deviation for the (w+1)-th level distribution, and m(w+1) is an estimated mean for the (w+1)-th level distribution.

In some embodiments, the multi-level memory cells may include multi-level data memory cells to store user data, and the method may further comprise processing signal samples provided by the multi-level data memory cells to facilitate the computations of the estimated means and variances of the level distributions of the multi-level memory cells. For these embodiments, the method may further include employing a binary tree to determine which of the M-levels perform each of the signal samples belong to, the computed slicer thresholds defining, at least in part, the binary tree. In some embodiments, the method may further include recomputing the estimated means and variances of the level distributions of the multi-level memory cells based on the signal samples provided by the multi-level data memory cells and according to the equations:

$$e'_k = r'_k - m_{k-1}(i)$$
$$m_k(i) = m_{k-1}(i) + \mu'_m \cdot e'_k$$
$$\sigma_k^2(i) = \sigma_{k-1}^2(i) + \mu'_v(e'_k \cdot e'_k - \sigma_{k-1}^2(i))$$

where for $0 \leq i \leq M-1$ and k is an integer greater than 0, $r_k'$ is a k-th signal sample from one of the multi-level data memory cells, $m_{k-1}(i)$ is an estimated mean of i-th level distribution for time k−1, $e_k'$ is an estimated error for time k, $m_k(i)$ is an estimated mean of i-th level distribution for time k, $m_{k-1}(i)$ is an estimated mean of i-th level distribution for time k−1, and $\mu_m'$ is a third adaptation constant, $$\sigma_k^2(i)$$

is an estimated variance of i-th level distribution for time k, $$\sigma_{k-1}^2(i)$$

is an estimated variance of i-th level distribution for time k−1, and $\mu_v'$ is a fourth adaptation constant.

In accordance with various embodiments, a system is provided comprising multi-level memory cells, an estimation block configured to compute estimated means and variances of level distributions of the multi-level memory cells by processing signal samples provided by at least a subset of the multi-level memory cells, the multi-level memory cells having M-levels where M is an integer greater than 1, and each of the level distributions is associated with a corresponding level of the M-levels, and a computation block configured to compute optimal or near optimal mean and detection threshold values based, at least in part, on the estimated mean and variances of the level distributions of the multi-level memory cells, the optimal or near optimal mean and detection threshold values to be used to facilitate writing and reading, respectively, of data to and from the multi-level memory cells.

These and other aspects of various embodiments of the present will be described in greater detail in the following description.

BRIEF DESCRIPTION OF THE DRAWINGS

The present invention will be described by way of exemplary embodiments, but not limitations, illustrated in the accompanying drawings in which like references denote similar elements, and in which:

FIG. 1 illustrates four threshold voltage distributions of an exemplary 2-bit memory cell;

FIG. 2 illustrates the four threshold voltage distributions of the exemplary 2-bit memory cell of FIG. 1 after cycling;

FIG. 4 illustrates an exemplary table structure of a look-up table, in accordance with various embodiments of the present invention;

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

For the purposes of the instant description, the phrase "A/B" means A or B. For the purposes of the instant description, the phrase "A and/or B" means "(A), (B), or (A and B)." For the purposes of the instant description, the phrase "at least one of A, B and C" means "(A), (B), (C), (A and B), (A and C), (B and C) or (A, B and C)." For the purposes of the instant description, the phrase "(A)B" means "(B) or (AB)," that is, A is an optional element.

The description may use the phrases "in various embodiments," or "in some embodiments," which may each refer to one or more of the same or different embodiments. Furthermore, the terms "comprising," "including," "having," and the like, as used with respect to embodiments of the present invention, are synonymous.

According to various embodiments of the present invention, adaptive read and write memory systems and methods are provided that may adapt to changes to level distributions of multi-level memory cells. In particular, the novel systems may be configured to compute new mean values of level distributions and/or new detection threshold values of multi-level memory cells (herein "memory cells") after the memory cells have degraded as a result of, for example, repeated cycling. For purposes of the following description, the computed new mean and detection threshold values will be referred to as "optimal or near optimal" values. That is, the phrase "optimal or near optimal" as used herein are in reference to the mew mean and detection threshold values that may be computed using either an optimal solution, which may be a more complex solution requiring more computational power, or a simpler near optimal (approximate) solution. As will be described herein, these values may be calculated whenever a read operation is performed on multi-level memory cells. As a result of the read operation, rough estimates for means and variances of the level distributions of the multi-level memory cells may be computed, which may be used to derive the optimal or near optimal solutions.

Figure 3:
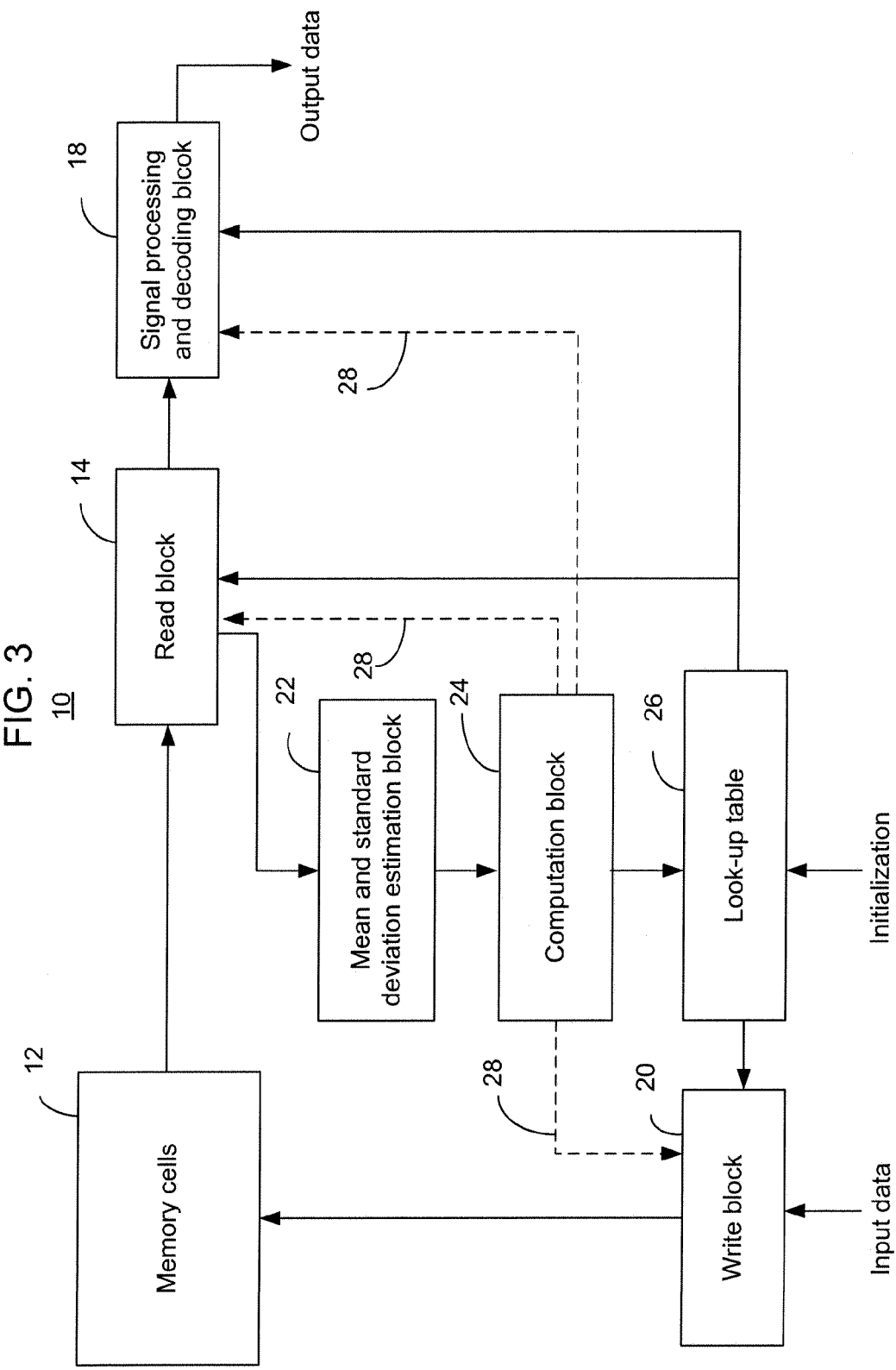
FIG. 3 illustrates an adaptive read/write memory system, in accordance with various embodiments of the present invention.

FIG. 3 depicts an adaptive read/write memory system in accordance with various embodiments of the present invention. The read/write memory system (herein "system") 10, as in conventional read/write memory systems, may include multi-level memory cells (or simply "memory cells") 12, which may be multi-level flash memory cells, a read block 14, a signal processing and decoding block 18, and write block 20. However, unlike conventional systems, the system 10 may further include a mean and standard deviation estimation block 22, a computation block 24, and a look-up table 26, operationally coupled together. One or more of the components depicted, such as the mean and standard deviation estimation block 22 and the computation block 24, may be implemented using hardware components, such as, for example, application specific integrated circuit (ASIC), and/or software.

In brief, and as will be described in greater detail herein, the mean and standard deviation estimation block (herein "estimation block") 22 may be configured to calculate estimated mean and standard deviation values of level distributions of the memory cells 12 during, for example, a read operation of the memory cells 12. More particularly, the estimation block 22 may be configured to compute, among other things, estimated means and variances (as well as standard deviations) of the level distributions of the multi-level memory cells 12. The computation block 24 may be configured to compute optimal or near optimal mean and detection threshold values based on the estimated mean and standard deviation values provided by the estimation block 22. As will be described herein, the optimal or near optimal mean values computed may be used in order to adaptively write data into the memory cells 12 while the detection threshold values computed may be used in order to adaptively read data stored in the memory cells 12.

The optimal or near optimal mean and detection threshold values computed by the computation block 24 and the estimated mean and standard deviation values calculated by the estimation block 22, in various embodiments of the present invention, may be stored in the look-up table 26. The read block 14, the signal processing and decoding block 18, and the write block 20 may use selected values stored in and provided by the look-up table 26 to perform various operations. Alternatively, such values may be directly provided by the estimation block 22 and the computation block 24 as indicated by reference 28.

As briefly described above, the estimation block 22 may calculate estimated means and variances (which may be used to derive standard deviations) of level distributions of the memory cells 12 during a read operation. The estimated means and variances (i.e., standard deviations), as well as "slicer thresholds," may be calculated as intermediate steps in order for the computation block 24 to eventually compute the optimal or near optimal mean and detection threshold values based, at least in part, on the estimated means and variances. Such estimated means and variances of the level distribution of the memory cells 12 may be based on signal samples provided by at least a subset of the memory cells 12. In various embodiments and as will be described herein, the estimation of the means and standard deviations may be achieved via training or online adaptation.

For example, the estimated means and standard deviations may be calculated by using pilot memory cells having known or predetermined data. That is, certain memory cells 12 may be designated as pilot memory cells, where the data stored in these memory cells are predefined and known, while other memory cells may be data memory cells that may be used for storing user data. The read block 14 may then exploit these pilot cells for estimating the mean and standard deviations as described in, for example, co-pending U.S. patent application Ser. No. 11/738,263, filed Apr. 20, 2007, entitled "Channel Estimation for Multi-Level Flash Memories Using Pilot Signals," which is hereby incorporated by reference in its entirety for all purposes. Such a method for estimating the means and standard deviations (i.e., variances) of level distributions of a memory cell is referred to herein as a "training" technique. Alternatively, online adaptation techniques may be employed for estimating the mean and standard deviations. For instance, the LMS (least-mean-squares) algorithm may be used to estimate the means and variances (i.e., standard deviations) based on the data recovered from the memory cells 12, which will be described in greater detail herein.

In order to perform the LMS algorithm, electrical voltages may be applied to at least a sub-set of the memory cells 12, which may or may not include pilot memory cells. As a result of the application of the electrical voltages, the memory cells 12 may output signal samples that may be read and processed by the estimation block 22 in order to estimate the means and variances of the level distributions of the memory cells 12 as will be further described in greater detail herein.

Based on the estimated mean and standard deviation values calculated by the estimation block 22, the computation block 24 may compute optimal or near optimal mean and detection threshold values for a memory cell or a group of memory cells. Specifics on how the optimal or near optimal mean and detection threshold values may be computed will be described in detail herein. The calculated optimal or near optimal mean and detection threshold values may then be stored in look-up table 26. An example of look-up table 26 is depicted in FIG. 4. In particular, FIG. 4 depicts an exemplary table structure 40 of look-up table 26 of FIG. 3, in accordance with various embodiments of the present invention.

In table structure 40, the "block index" column 41 on the far left is in reference to a block of memory cells. The second and third columns 42 and 43 from the left are for estimated mean and standard deviation values calculated by the estimation block 22. The two columns 44 and 45 on the right are for the optimal or near optimal mean and detection threshold values as computed by the computation block 24. Thus, in this example, a block or a group of memory cells may be associated with common estimated mean and standard deviation values, as well as common optimal or near optimal mean and detection threshold values.

Since a multi-level memory cell may have multiple level distributions, multiple estimated mean and standard deviation values, as well as multiple optimal or near optimal mean and detection threshold values may be calculated and stored in the table structure 40 for a memory cell (in this example, for each group of memory cells). Thus, for the second and third columns, the "estimated mean values" column and the "estimated standard deviations" column, there are multiple mean ($m_0, m_1, \ldots$) and standard deviation ($\sigma_0, \sigma_1, \ldots$) values for each of the multiple levels of a multi-level cell (see FIG. 1). Similarly, there may be multiple values included in the fourth and fifth columns 44 and 45 for the "near optimal mean values" and the "near optimal detection thresholds."

Although the computation block 24, in some embodiments of the present invention, may compute the optimal or near optimal mean and detection threshold values as soon as the estimated mean and standard deviations are calculated by the estimation block 22, as appears to be case in the above described embodiment, in some alternative embodiments, the optimal or near optimal mean and detection threshold values may be computed at some later time after the estimated mean values and estimated standard deviation values have already been stored in the table 26.

As described previously, the optimal or near optimal detection threshold values computed may be used during a read operation of one or more multi-level memory cells. In using the optimal or near optimal detection threshold values, error resulting from reading a degraded memory cell as a result of repeated cycling may be minimized.

Figure 5:
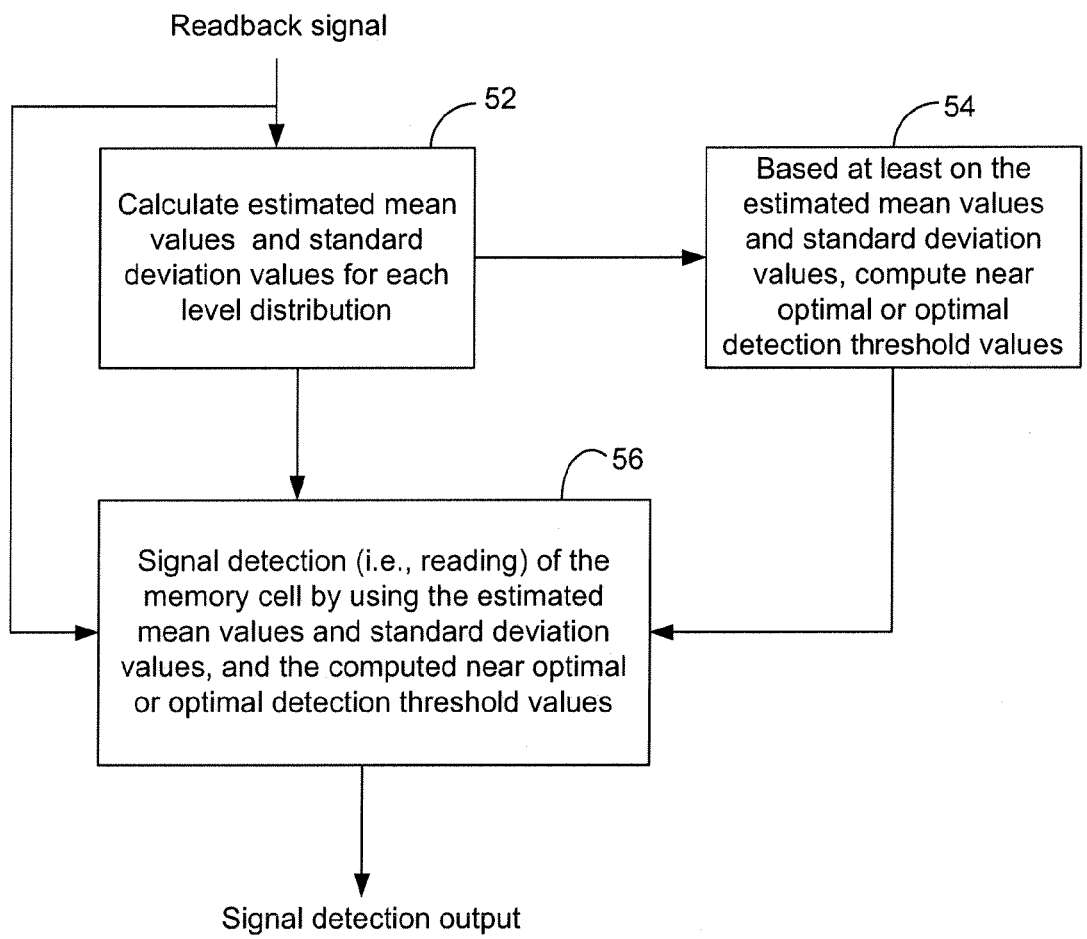
FIG. 5 illustrates an adaptive signal detection flow process for reading multi-level memory cells using computed optimal or near optimal detection threshold values, in accordance with various embodiments of the present invention.

Referring now to FIG. 5, an adaptive signal detection flow process for reading multi-level memory cells based, at least in part, on computed optimal or near optimal detection threshold values in accordance with various embodiments of the present invention is illustrated. The process 50 may begin when the latest estimated mean values and standard deviation values for level distributions of the multi-level memory cells are calculated at 52. The latest estimated mean values and standard deviation values may be calculated based on, for example, readback signals of pilot memory cells or online adaptation techniques as described previously.

Based at least on the estimated mean values and standard deviation values, optimal or near optimal detection threshold values may be computed at 54. The optimal or near optimal detection threshold values may be computed using a linear solution, which may be an approximate or near optimal solution, or Newton's method, which may be an optimal solution), both of which will be described in greater detail herein. Signal detection (i.e., reading) of the readback signal may then be performed using the estimated mean values and standard deviation values, and the computed near optimal detection threshold values at 56.

In contrast to the computed optimal or near optimal detection threshold values, the computed optimal or near optimal mean values may be used during a write operation to program a memory cell. That is, although optimal or near optimal mean values may be calculated (along with the near optimal detection threshold values) for a multi-level memory cell during or after a read operation of the multi-level memory cell, the optimal or near optimal mean values may not be used until a subsequent write (i.e., programming) operation of the memory cell. The computed optimal or near optimal mean values may be used to more reliably program multi-level memory cells during a write operation, particularly for example, those multi-level memory cells that have been repeatedly cycled.

Figure 6:
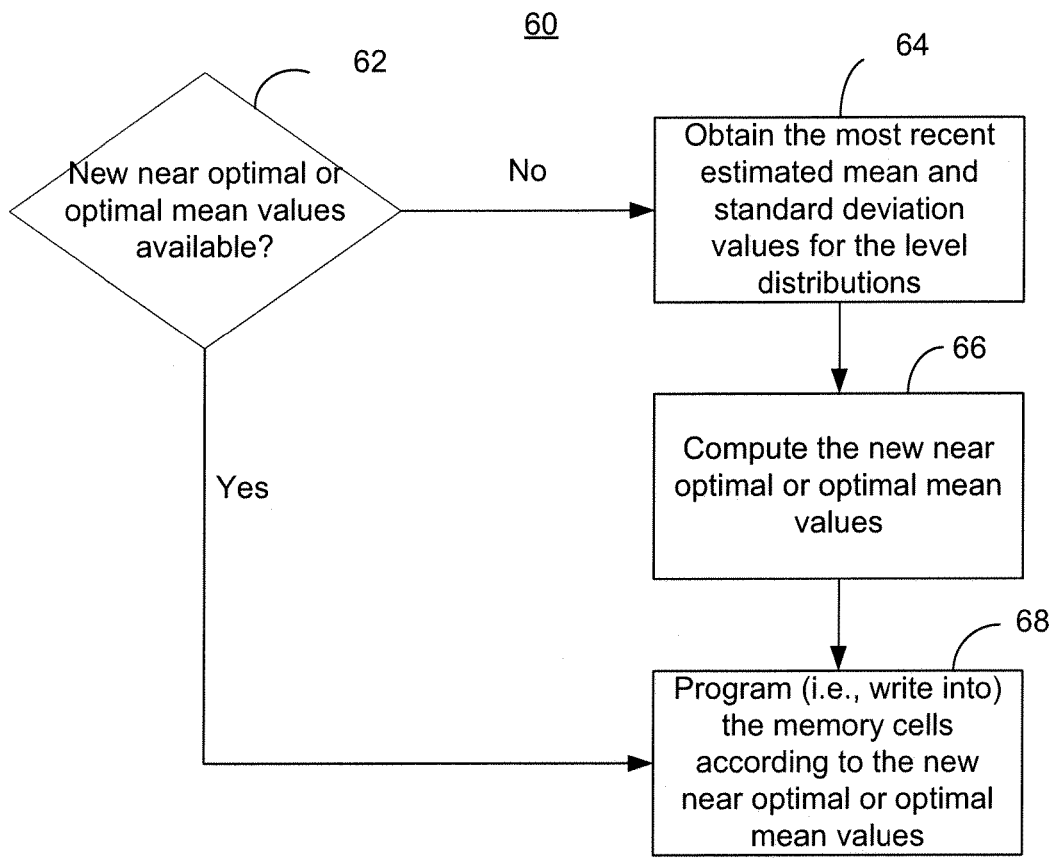
FIG. 6 illustrates an adaptive flow process for a write operation of multi-level memory cells, in accordance with various embodiments of the present invention.

FIG. 6 illustrates an adaptive flow process for a write operation of multi-level memory cells, according to various embodiments of the present invention. The process 60 may begin when a determination is made as to whether new optimal or near optimal mean values for the memory cells are available at 62. In some instances, new optimal or near optimal mean values for the memory cells may have already been calculated and stored, such as those that may be stored in look-up table 26. If so, the memory cells may be programmed (i.e., written) in accordance with the new optimal or near optimal mean values at 68. If not, then the most recent estimates of mean and standard deviation values for the level distributions of the memory cells are obtained either from the look-up table 26, or are calculated at 64. Based on the estimated mean and standard deviation values, new optimal or near optimal mean values are computed at 66 using a linear solution (i.e., near optimal solution) or Newton's method (i.e., optimal solution). After computing the optimal or near optimal mean values, the memory cells may be programmed (i.e., written) according to the optimal or near optimal mean values at 68.

In order to calculate optimal or near optimal mean and detection threshold values of multi-level memory cells, it is recognized that many parameters associated with multi-level memory cells including, for example, the means and standard deviations of the lowest and highest level distributions (e.g., the level distributions of level 0 and level 3 of FIG. 1) are functions of the memory cells and are not easily controllable. Given these values, however, it may be possible to optimize a read/write memory system by adjusting the means of level distributions (except for the means associated with the lowest and highest level distributions) during programming of the memory cells. In addition, for hard decision detection in a read operation, the detection threshold values may be optimized according to the current or most recent level distributions for minimum probability of error. In other words, optimal or near optimal mean and detection threshold values may be determined for write and read operations of multi-level memory cells in order to reduce error if certain parameters such as the means and standard deviations of the lowest and highest level distributions are assumed to be determined by the device characteristics.

Figure 7:
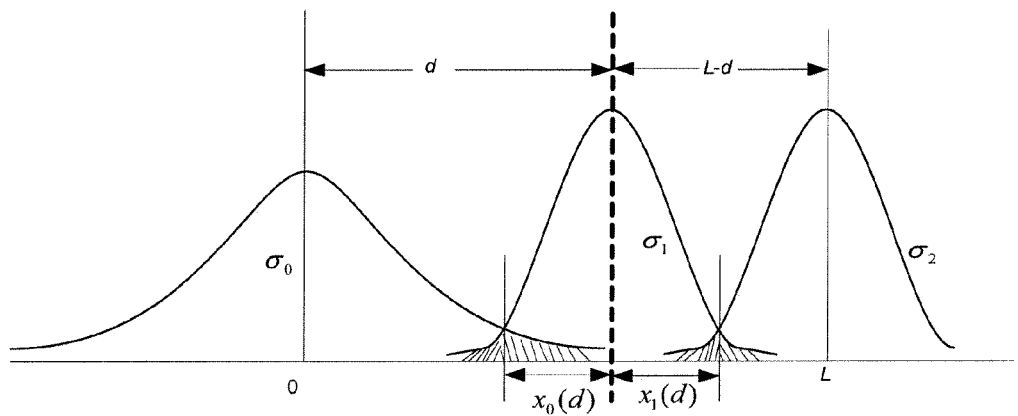
FIG. 7 illustrates a 3-level threshold voltage distribution ("3-level distribution") of an exemplary multi-level memory cell, in accordance with various embodiments of the present invention.

In order to obtain an optimal solution for computing optimal mean and detection threshold values, reference is now made to FIG. 7, which depicts an exemplary 3-level threshold voltage distribution ("3-level distribution"). For this example, the respective standard deviations for the 3 level distributions are $\sigma_0$, $\sigma_1$, and $\sigma_2$. For purposes of illustration, assume that the level distribution means fall in the range between 0 and L, where L is the distance or range between the mean of the lowest level distribution (i.e., the left-most level distribution in FIG. 7) and the mean of the highest level distribution (i.e., the right-most level distribution in FIG. 7). Then the mean of the middle level distribution may be denoted by d. Once d is given, the crossing points of the probability density functions (pdf's) may also be determined. In this example the distances of the crossing points from d are denoted by $x_0(d)$ and $x_1(d)$, respectively.

From signal detection theory, it is known that the optimal detection thresholds for multi-level memory cells are the crossing points of the pdf's. In the following, the pdf's are first shown to maintain the same value at the crossing points (i.e., detection thresholds) when minimum probability of error is achieved. The shaded areas in FIG. 7 correspond to the error regions. It is not difficult to see that the probability of making an error in detection is given by $$P_e = \int_{\frac{d-x_0(d)}{\sigma_0}}^{\infty} N(0,1) + \int_{\frac{x_0(d)}{\sigma_1}}^{\infty} N(0,1) + \int_{\frac{x_1(d)}{\sigma_1}}^{\infty} N(0,1) + \int_{\frac{L-d-x_1(d)}{\sigma_2}}^{\infty} N(0,1)$$

where N(0,1) denotes the standard Gaussian distribution function with zero mean and variance 1. Taking the derivative of $P_e$ with respect to d, it follows that $$\frac{\partial P_e}{\partial d} = 0 = g\left(\frac{d-x_0(d)}{\sigma_0}\right) \cdot \frac{1}{\sigma_0} \cdot \frac{\partial(d-x_0(d))}{\partial d} + \qquad \text{Eq. (1)}$$
$$g\left(\frac{x_0(d)}{\sigma_1}\right) \cdot \frac{1}{\sigma_1} \cdot \frac{\partial(x_0(d))}{\partial d} + g\left(\frac{x_1(d)}{\sigma_1}\right) \cdot \frac{1}{\sigma_1} \cdot \frac{\partial(x_1(d))}{\partial d} +$$
$$g\left(\frac{L-d-x_1(d)}{\sigma_2}\right) \cdot \frac{1}{\sigma_2} \cdot \frac{\partial(L-d-x_1(d))}{\partial d}$$

where $$g(x) = \frac{1}{\sqrt{2\pi}} e^{-x^2/2}.$$

Noting that $$g\left(\frac{d-x_0(d)}{\sigma_0}\right) \cdot \frac{1}{\sigma_0} = g\left(\frac{x_0(d)}{\sigma_1}\right) \cdot \frac{1}{\sigma_1}$$

and $$g\left(\frac{x_1(d)}{\sigma_1}\right) \cdot \frac{1}{\sigma_1} = g\left(\frac{L-d-x_1(d)}{\sigma_2}\right) \cdot \frac{1}{\sigma_2}$$

to obtain $$g\left(\frac{d-x_0(d)}{\sigma_0}\right) \cdot \frac{1}{\sigma_0} = g\left(\frac{L-d-x_1(d)}{\sigma_2}\right) \cdot \frac{1}{\sigma_2}$$

The above equation is the result after canceling out the equal terms in Eq. (1). This completes the proof. Extensions to more than 3 levels are similar. For ease of reference, the above property will be referred to, herein, as "Equal Value Property."

Figure 8:
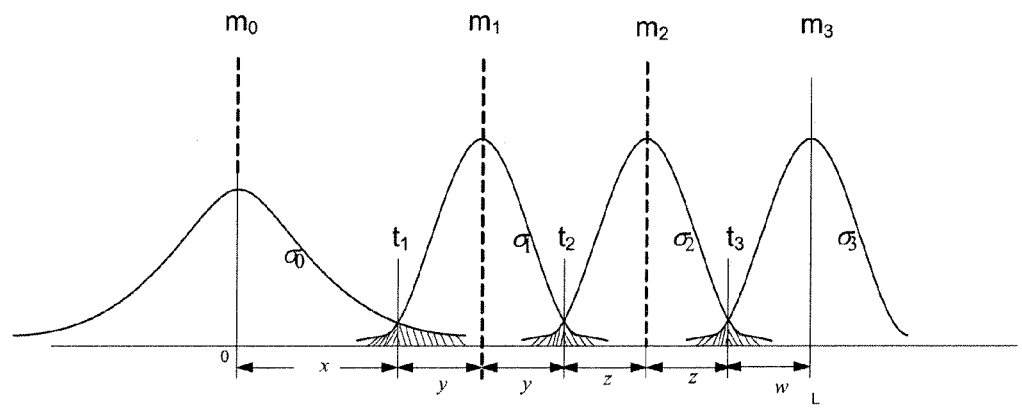
FIG. 8 illustrates a 4-level threshold voltage distribution ("4-level distribution) of an exemplary multi-level memory cell, in accordance with various embodiments of the present invention.

As an example, the "Equal Value Property" may be used to solve the optimization problem for a 4-level distribution, which is depicted in FIG. 8. For the 4-level distribution example depicted in FIG. 8, the mean range is between 0 and L, the means of the level distributions are denoted as $m_0$, $m_1$, $m_2$, and $m_3$, the detection thresholds for the level distributions are denoted as $t_1$, $t_2$, and $t_3$, and the respective standard deviations of the level distributions are denoted as $\sigma_0$, $\sigma_1$, $\sigma_2$, and $\sigma_3$. The distances between the means and the detection thresholds, as depicted, are x, y, z, and w. In order to determine the optimal solutions for x, y, z, and w, the following set of equations may be used:

$$\begin{cases} \frac{1}{\sigma_0} e^{-\frac{x^2}{2\sigma_0^2}} = \frac{1}{\sigma_1} e^{-\frac{y^2}{2\sigma_1^2}} = \frac{1}{\sigma_2} e^{-\frac{z^2}{2\sigma_2^2}} = \frac{1}{\sigma_3} e^{-\frac{w^2}{2\sigma_3^2}} \\ x + 2y + 2z + w = L. \end{cases}$$

Numerical approaches may be used to solve the above equations. For example, the constraint in Eq. (2) may be integrated into Eq. (3) by defining a constant C viz:

$$\begin{cases} \frac{1}{\sigma_0} e^{-\frac{x^2}{2\sigma_0^2}} = \frac{1}{\sigma_1} e^{-\frac{y^2}{2\sigma_1^2}} = \frac{1}{\sigma_2} e^{-\frac{z^2}{2\sigma_2^2}} = \frac{1}{\sigma_3} e^{-\frac{w^2}{2\sigma_3^2}} = C \\ x + 2y + 2z + w = L. \end{cases} \quad \text{Eq. (4)}$$

Now, C may be found by using Newton's method to solve $$f(x) = x + 2y + 2z + w - L$$

$$= g(\sigma_0, C) + 2g(\sigma_1, C) + 2g(\sigma_2, C) + g(\sigma_3, C) - L.$$

where $g(\sigma, C) = \sigma\sqrt{-2\ln(\sigma C)}$

After taking the derivative of f(x) with respect to C, the following is obtained:

$$df(x)/dC = d(x + 2y + 2z + w - L)/dC =$$
$$\frac{-\sigma_0}{g(\sigma_0, C)} + \frac{-2\sigma_1}{g(\sigma_1, C)} + \frac{-2\sigma_2}{g(\sigma_2, C)} + \frac{-\sigma_3}{g(\sigma_3, C)}.$$

Now, C can be found through the following iteration $$C_{n+1} = C_n - \frac{f(C_n)}{f'(C_n)}.$$

The solution converges very fast for good initial values of C. Once C is solved, the x, y, z, and w values may easily follow. Thus, equation (2) and (3) may be used in order to obtain what has been referred to previously as, the optimal solution.

Although, the above solution may be very accurate, approximations may be used to simplify the computation and obtain a near optimal solution. For example, taking the logarithm of the first equation of Eq. (2), the following may be obtained:

$$\frac{x^2}{2\sigma_0^2} = \frac{y^2}{2\sigma_1^2} + \ln\left(\frac{\sigma_1}{\sigma_0}\right). \quad \text{Eq. (5)}$$

Note that for practical applications, the ratio between $\sigma_1$ and $\sigma_0$ is close to 1, which after taking the logarithm are negligible comparing to other terms in Eq. (5). Ignoring the term $$\ln\left(\frac{\sigma_1}{\sigma_0}\right),$$

it follows that $$\frac{x}{\sigma_0} = \frac{y}{\sigma_1}.$$

Similar approximations also hold true for z and w. Thus, the near optimal solutions may be obtained as $$\begin{cases} x = \frac{\sigma_0}{\sigma_0 + 2\sigma_1 + 2\sigma_2 + \sigma_3} L \\ y = \frac{\sigma_1}{\sigma_0 + 2\sigma_1 + 2\sigma_2 + \sigma_3} L \\ z = \frac{\sigma_2}{\sigma_0 + 2\sigma_1 + 2\sigma_2 + \sigma_3} L \\ w = \frac{\sigma_3}{\sigma_0 + 2\sigma_1 + 2\sigma_2 + \sigma_3} L \end{cases}.$$

These solutions may be referred to, for purposes of this description as linearized solutions and they are near optimal under practical operating conditions. That is, once x, y, z, and w are solved, approximate (i.e., near optimal) solutions may be determined for the mean and detection threshold values of 4-level memory cells. It should be noted, however, that the above formulation may be easily extended to any M number of levels for $M \geq 2$.

Based on the above near optimal solution, and once the estimated mean and standard deviations for all the distributions have been determined using, for example, pilot cells, it may be straightforward to find the near optimal detection threshold values. For example, if the estimated mean and standard deviation values of the level distributions for a 4-level (2 bit/cell) flash memory device are found to be $\{m_i, i=0,1,2,3\}$ and $\{\sigma_i, i=0,1,2,3\}$, respectively. Utilizing the linearized solution (i.e., near optimal solution), one may obtain:

$$\begin{cases} t_1 = \dfrac{m_1\sigma_0 + m_0\sigma_1}{\sigma_0 + \sigma_1} \\ t_2 = \dfrac{m_2\sigma_1 + m_1\sigma_2}{\sigma_1 + \sigma_2} \\ t_3 = \dfrac{m_3\sigma_2 + m_2\sigma_3}{\sigma_2 + \sigma_3} \end{cases}$$

where $t_1$, $t_2$ and $t_3$ are the near optimal signal detection thresholds. Thus, the near optimal detection thresholds, $t_1$, $t_2$ and $t_3$, of a 4-level multi-level memory may be solved using the above equations. If more accuracy is desired, exact solutions may always be found by utilizing the Equal Value Property through the Newton's method illustrated previously.

The near optimal mean values for multi-level memory cells may be obtained as follows. For a M level memory cell, assume that the estimated voltage means are denoted as $\{m_i, i=0, 1, \ldots M-1\}$ and the corresponding standard deviations as $\{\sigma_i, i=0, 1, \ldots, M-1\}$. Due to physical reasons and as previously alluded to, the mean values corresponding to the lowest ($m_0$) and highest levels ($m_{M-1}$) and the standard deviations are not easily controllable, thus such values are assumed to be predefined and set. However, the values of $m_i$, $i=1, 2, \ldots, M-2$ may be adjusted for optimal performance. By denoting $L = m_{M-1} - m_0$ and utilizing the linearized solutions, the near optimal mean value ($\tilde{m}$) for the i-th level is given by $$\tilde{m}_i = m_0 + \dfrac{\sigma_0 + 2\sum_{k=1}^{i-1} \sigma_k + \sigma_i}{\sigma_0 + 2\sum_{k=1}^{M-2} \sigma_k + \sigma_{M-1}} L \qquad \text{Eq. (6)}$$

Thus, the above equation may be used to solve for near optimal mean values of M-level distribution memory cells in accordance with various embodiments of the present invention. Alternatively, the Newton's method may be used for more accuracy.

Referring back to FIG. 3, as described previously, estimation block 22 may be used in order to obtain a rough estimate of the means and variances of the level distributions of the multi-level memory cells 12 that may used, at least in part, to compute optimal or near optimal means and threshold values. In order to do so, the estimate block 22 may, in some embodiments, employ LMS techniques to estimate the means and variances (i.e., standard deviations) of level distributions of the multi-level memory cells 12 as will be described herein.

Figure 9:
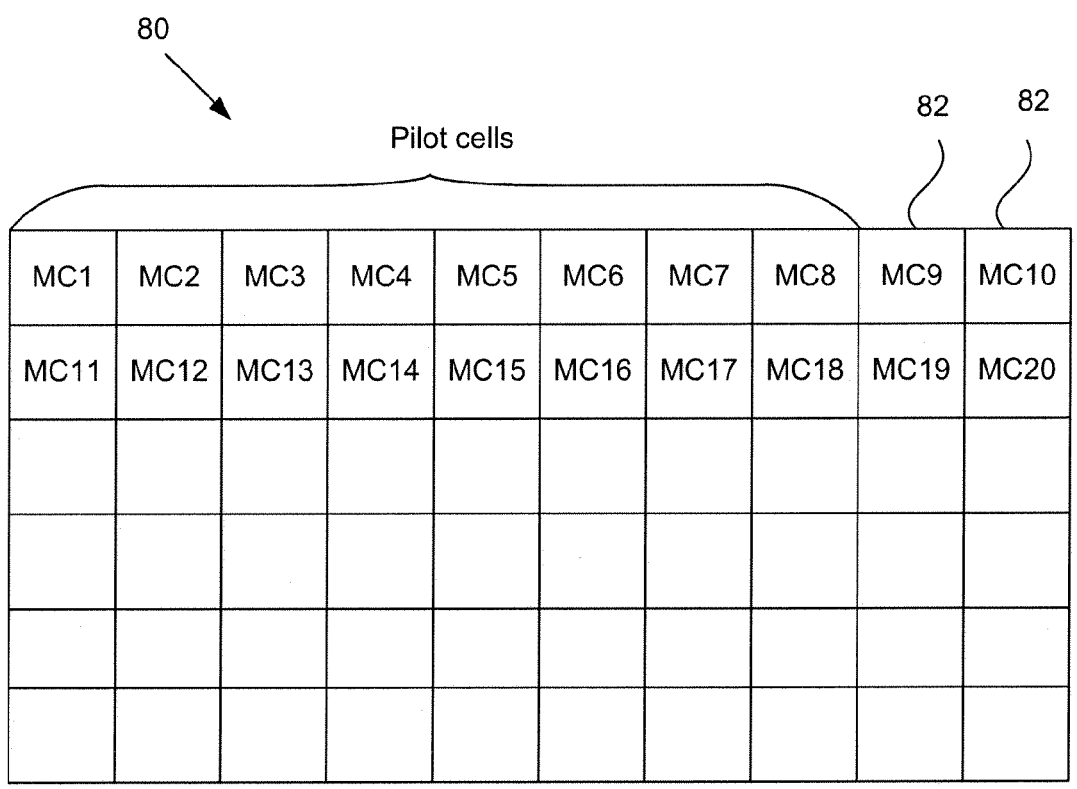
FIG. 9 illustrates an array of multi-level memory cells, in accordance with various embodiments of the present invention.

In some embodiments, the multi-level memory cells 12 may include an array of multi-level memory cells, such as the exemplary multi-level memory cell array depicted in FIG. 9. In this example, the array 80 includes six rows and ten columns of multi-level memory cells (or simply "memory cells") 82, the first two rows of the memory cells 82 being labeled as MC1, MC2, MC3, and so forth. Note that in alternative embodiments, the array 80 may include more or fewer memory cells 82. Although all or most of the memory cells 82 may be data memory cells for storing user data, in some embodiments, the array 80 may include a sub-set of pilot memory cells (hereinafter "pilot cells") in addition to the data memory cells. In this example, memory cells MC1 to MC8 are pilot cells that may store predetermined or known data (i.e., charge levels) while the rest of the memory cells (e.g., MC9 to MC20, and the unlabeled memory cells in the bottom four rows) may be data memory cells storing data that may not be prior-known. In the case where pilot cells are included in the array 80 and the multi-level memory cells 82 are 2-bit memory cells (i.e., 4-levels), a minimum of 4 pilot cells may be needed in order to store the four different charge levels. Similarly, if the multi-level memory cells 82 are 4-bit memory cells (i.e., 8-levels), then a minimum of 8 pilot cells may be needed.

In various embodiments, the read/write memory system 10 of FIG. 3, and in particular, the estimation block 22, may maintain registers (not depicted) in order to at least track the latest or the most current estimated means and variances of the level distributions of the memory cells 82. Such registers may be updated each time the estimation block 22 computes new estimated means and variances for the memory cells 82 based on sample signals provided by a group of one or more memory cells 82. Registers for the most current estimated means and the most current variances may be maintained for each level distribution. In addition, registers for "slicer thresholds" may also be maintained. In brief, and as will be further described herein, a slicer threshold is similar to the detection threshold described previously and is in essence, the rough boundary point or line that distinguishes two adjacent levels. Thus, for 2-bit (4-level) memory cells, three slicer thresholds may be needed—see, for example, FIG. 1. Similarly, for 4-bit (8 level) memory cells, seven slicer thresholds may be needed. Another way to view the slicer threshold is that they are the initial rough estimates of the detection thresholds previously described. The relevance of the slicer thresholds may become more apparent in the following description.

Figure 10:
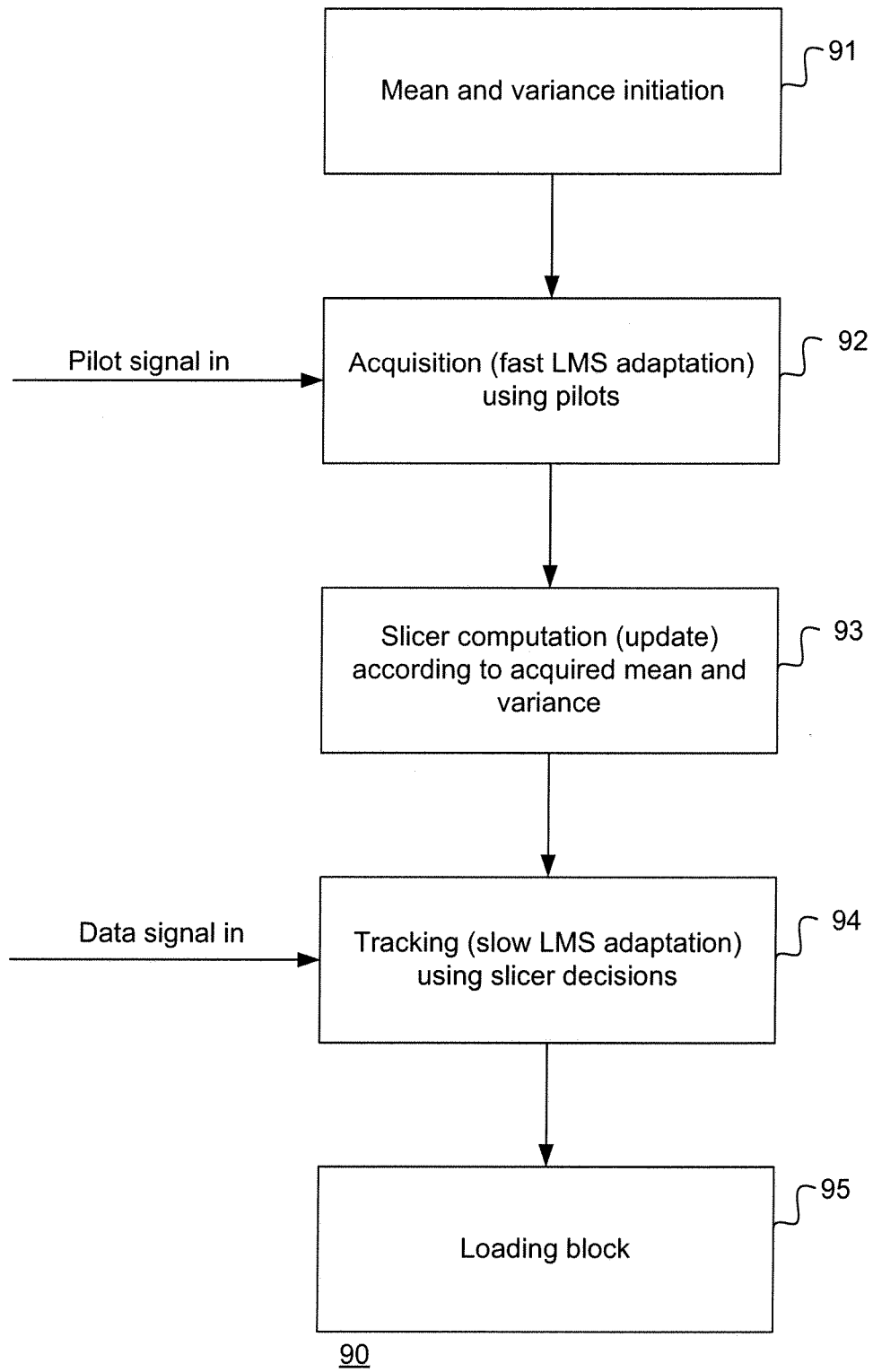
FIG. 10 illustrates a flow process for computing estimated means and variances for level distributions of multi-level memory cells, in accordance with various embodiments of the present invention.

FIG. 10 is a flow process for estimating means and variances of level distributions of multi-level memory cells in accordance with various embodiments of the present invention. In some embodiments, the process 90 may be implemented by the estimation block 22 of FIG. 3. The process 90 includes, among other things, two distinct phases, an acquisition phase (i.e., blocks 92 and 93) and a tracking phase (i.e., block 94). Both of these phases may individually produce estimated means and variances of level distributions of multi-level memory cells 82. Thus, in some alternative embodiments, at least one of the acquisition and tracking phases may be omitted to reduce the amount of processing needed and to reduce latency. However, by using the two phases in combination, more refined estimated means and variances may be obtained. For purposes of this description, the estimated mean, standard deviation, and variance for the i-th level distribution will be represented by $m(i)$, $\sigma(i)$, and $$\sigma^2(i),$$

respectfully, where $i=0, \ldots M-1$, and M is the number of level distributions (or simply "levels") of the multi-level memory cells 82. For M-1 slicer thresholds, the slicer thresholds will be denoted by $s(w)$, where $w=0, \ldots M-2$.

The process 90 may begin when an initialization procedure may be implemented at block 91. The initialization procedure may be executed by assigning predetermined initial default values to the means m(i) and variances $\sigma^2(i)$ of the level distributions. When registers are employed to maintain the most current estimated means and variances for the level distributions, such registers may be initially populated with the initial default values. Such default values may be determined during the manufacture of the memory cells 82.

Using these initial means and variances for the level distributions, initial slicer thresholds may be optionally computed according to the equations:

$$s'(w) = m'(w) + \frac{\sigma'(w)}{\sigma'(w) + \sigma'(w+1)}[m'(w+1) - m'(w)] \qquad \text{Eq. (7)}$$

where w=0, ... M−2, s'(w) is the initial w-th slicer threshold, m'(w) is the initial mean (default value) for the w-th level distribution, σ'(w) is an initial standard deviation for the w-th level distribution that is equal to square root of the initial variance (default value) for the w-th level distribution, σ'(w+1) is an initial standard deviation for the (w+1)-th level distribution that is equal to the square root of the initial variance (default value) for the (w+1)-th level distribution, and m'(w+1) is the initial mean (default value) for the (w+1)-th level distribution.

As will be further described herein, these initial means, variances, and slicer thresholds provided during the initialization process may be subsequently used to compute more accurate estimated means and variances of the level distributions of multi-level memory cells 82. Note that in the above, the initial slicer threshold may only be optionally computed in the initialization stage because in some embodiments where the tracking phase (i.e., block 94) is not performed, the above process for computing the initial slicer thresholds may be omitted. On the other hand, if the adaptation phase (i.e., blocks 92 and 93) is omitted instead and only the tracking phase (i.e., block 94) is performed in order to compute the estimated means and variances, then the above procedure for determining initial slicer thresholds during the initialization stage may be performed.

After initialization, the acquisition phase (i.e., blocks 92 and 93) may be performed by processing signal samples provided by pilot cells at block 92. Note that both the acquisition phase, as particularly depicted by block 92, as well as the tracking phase, as depicted by block 94, may be executed using least mean square (LMS) techniques. In various embodiments, the acquisition phase may be referred to as a fast LMS adaptation process while the tracking phase may be referred to as a slow LMS adaptation process. The "fast" and "slow" in this case refers to the acquisition adaptation phase (e.g., blocks 92) using adaptation constants ($\mu_v$ and $\mu_m$), which are error terms, that are larger (in some cases, much larger) than the adaptation constants ($\mu_v'$ and $\mu_m'$) used in the tracking phase (i.e., block 94)—see equations 9, 11, 14, and 15.

The acquisition phase at block 92 may further include two distinct stages, a stage for computing an estimated mean of a level distribution; and a stage for computing an estimated variance for the same level distribution. In some embodiments, the two stages may be performed sequentially whereby the computation of the estimated mean is performed first before the computation of the estimated variance is performed. During the first stage, an estimated mean for a level distribution may be calculated by processing a signal sample provided by at least one of the pilot cells and using the following equations:

$$e_k' = r_k - m_{k-1}(i) \qquad \text{Eq. (8)}$$

$$m_k(i) = m_{k-1}(i) + \mu_m \cdot e_k' \qquad \text{Eq. (9)}$$

where for 0≤i≤M−1 is an integer greater than 0, $r_k$ is a k-th signal sample from one of the pilot cells, $m_{k-1}(i)$ is an estimated mean of i-th level distribution for time k−1, $e_k'$ is an initial estimated error for time k, $m_{k-1}(i)$ is an estimated mean of i-th level distribution for time k−1, and $\mu_m$ is a first adaptation constant.

In the second stage, an estimated variance for a level distribution may be computed in accordance with the following equation:

$$e_k = r_k - m_k(i) \qquad \text{Eq. (10)}$$

$$\sigma_k^2(i) = \sigma_{k-1}^2(i) + \mu_v(e_k \cdot e_k - \sigma_{k-1}^2(i)) \qquad \text{Eq. (11)}$$

where $e_k$ is a refined estimated error for time k based, at least in part, on the estimated error $e_k'$ derived in the first stage using equation 8, $$\sigma_k^2(i)$$

is an estimated variance of i-th level distribution for time k, $$\sigma_{k-1}^2(i)$$

is an estimated variance of i-th level distribution for time k−1, and $\mu_v$ is a second adaptation constant. Note that the refined estimated error $e_k$ is based on the estimated mean $m_k(i)$ derived in the first stage (see Eq. 9) and is a more refined or accurate error term than the initial estimated error $e_k'$ of equation (8). In other words, the error term $e_k$ may be computed twice for each signal sample processed.

In some embodiments, the first and second adaptation constants $\mu_m$ and $\mu_v$ used in Eqs. 9 and 11 may be relatively large. For instance, in some embodiments, $\mu_m$ may have a value of, for example, $2^{-3}$ and $\mu_v$ may have a value of, for example, $2^{-4}$.

Once the estimated means and variances of the level distributions for the multi-level memory cells have been computed via the adaptation process, slicer thresholds may be computed at block 93. In some embodiments in which initial slicer thresholds were computed during the initialization procedure, this may mean updating the slicer thresholds that may have already been stored in the registers during the initialization procedure. In order to compute the slicer thresholds, estimated standard deviations for each of the level distributions may be calculated based on the estimated variances, wherein the estimated standard deviation σ(i) of the i-th level distribution is equal to the square root of the estimated variance $\sigma^2(i)$ of the i-th level distribution. The w-th slicer threshold may then be calculated in accordance with the following equation:

$$s(w) = m(w) + \frac{\sigma(w)}{\sigma(w) + \sigma(w+1)}[m(w+1) - m(w)] \qquad \text{Eq. (12)}$$

where for 0≤w≤M−2, s(w) is an w-th slicer threshold, m(w) is an estimated mean for the w-th level distribution, σ(w) is a standard deviation for the w-th level distribution, σ(w+1) is a standard deviation for the (w+1)-th level distribution, and m(w+1) is an estimated mean for the (w+1)-th level distribution.

Once the slicer thresholds have been determined via Eq. 12 (or via Eq. 7 in embodiments where the acquisition phase, e.g., blocks 92 and 93, is omitted), the calculated slicer thresholds may be used in order to define, at least in part, a binary tree to be used during the tracking phase. The binary tree, as at least partly defined by the previously calculated slicer thresholds, is needed in the tracking phase (as represented by block 94 in FIG. 10) because signal samples provided by multi-level data memory cells are processed and used to compute estimated means and variances. Since data stored in the multi-level data memory cells (or simply data memory cells) are not prior-known. Thus, the binary tree may be used in order to determine which level distributions do the provided signal samples belong to. In the binary tree, the slicer thresholds are used as comparators as will be further described herein.

Figure 11:
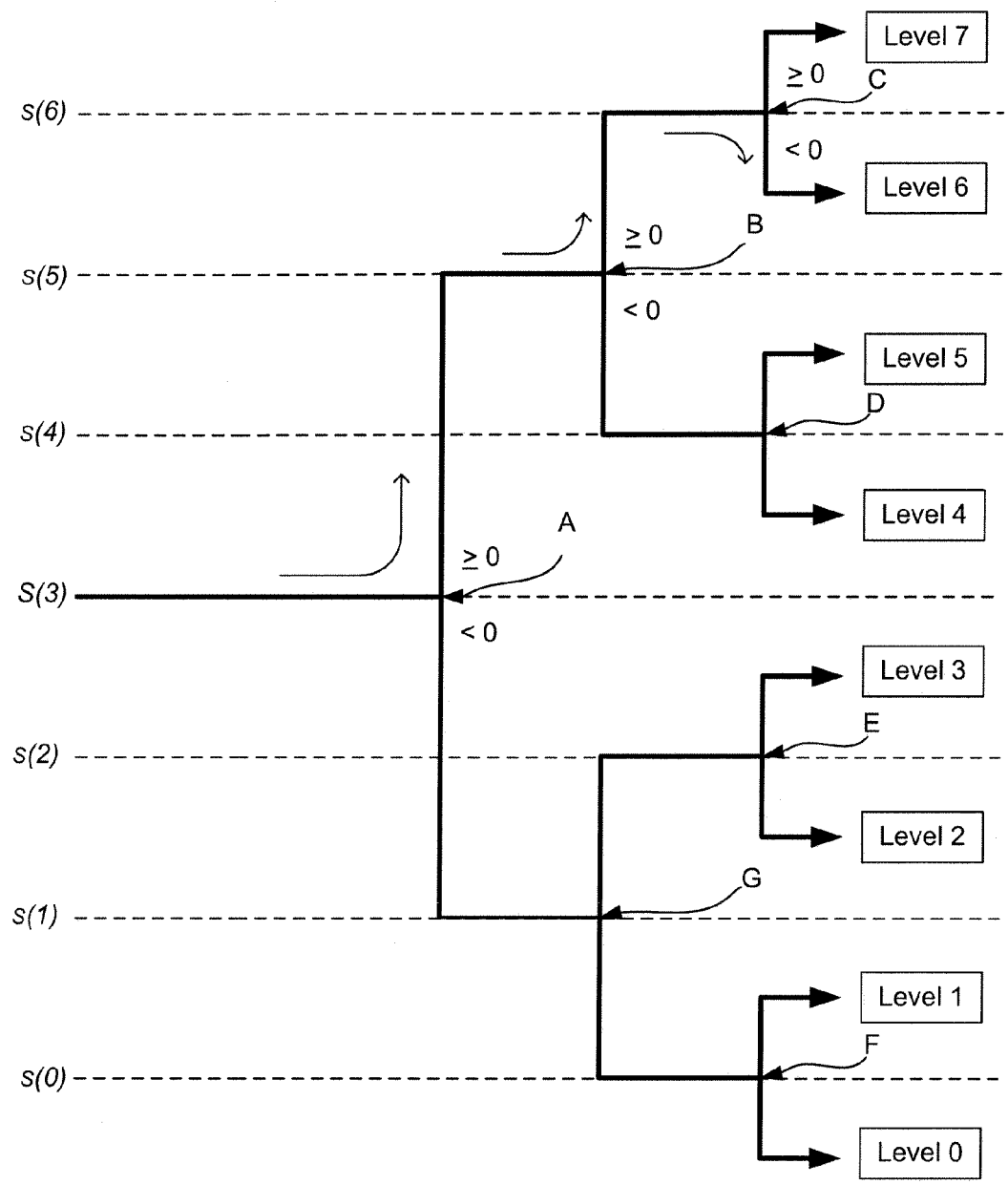
FIG. 11 is a binary tree, in accordance with various embodiments of the present invention.

FIG. 11 illustrates a binary tree for 3-bit (i.e., 8-level) memory cells in accordance with various embodiments. The tree 100 is represented by the dark solid line, and the s(i) on the left side of the tree 100 represents slicer thresholds that may have been calculated using, for example, the previously described acquisition and/or initialization procedures. On the right side are the eight levels from level 0 to level 7 of the 3-bit memory cells. There are seven decision points (A, B, C, D, E, F, and G) on the tree 100. At each decision point, the tree splits to an upper and a lower branch. The relevance of the binary tree 100 may be best understood with the following example.

Suppose one of the multi-level data memory cells of the array 80 of FIG. 9 provides a signal sample r. Suppose further that the signal sample r is actually associated with level 6, which is not prior-known. When the signal sample r is initially read or processed by, for example, the estimation block 22 of FIG. 3, the signal sample r may be compared to slicer threshold s(3) at decision point A of tree 100. The comparison should indicate that signal sample r is greater than s(3). As a result, the process moves to the upper branch, and signal sample r is then compared to slicer threshold s(5) at decision point B. The second comparison should indicate that signal sample r is greater than r(5). As a result, the process moves to the upper branch, and signal sample r is then compared to slicer threshold s(6). The comparison at decision point C should indicate that signal sample r is less than s(6). As a result, a determination may be made that signal sample r belongs to level 6.

The following summarizes the above example:
1. r−s(3)≥0, s(5) is the next comparison threshold.
2. r−s(5)≥0, s(6) is the next comparison threshold.
3. r−s(6)<0, level 6 is the slicer decision.

The use of a binary tree such as tree 100 may advantageously reduce the amount of processing needed in order to determine which level a signal sample from a data memory cell may belong to. In this case, only three decisions were needed in order to determine which level a signal sample r belongs to. For 2-bit (4-level) memory cells, the corresponding binary tree will be half the size of tree 100 with only 2 decision points. For 4-bit (16 level) memory cells, the corresponding binary decision tree will be twice the size of tree 100 with 4 decision points.

After using the tree 100 to determine which levels do signal samples provided by the multi-level data memory cells belong to, the tracking process depicted in block 94 may then resume when estimated means and variances of the level distributions of the multi-level memory cells are computed (or recomputed) based on the signal samples provided by the multi-level data memory cells and according to the equations:

$$e'_k = r'_k - m_{k-1}(i) \qquad \text{Eq. (13)}$$

$$m_k(i) = m_{k-1}(i) + \mu'_m \cdot e'_k \qquad \text{Eq. (14)}$$

$$\sigma^2_k(i) = \sigma^2_{k-1}(i) + \mu'_v(e'_k \cdot e'_k - \sigma^2_{k-1}(i)) \qquad \text{Eq. (15)}$$

where for 0≤i≤M−1 and k is an integer greater than 0, $r_k'$ is a k-th signal sample from one of the multi-level data memory cells, $m_{k-1}(i)$ is an estimated mean of i-th level distribution for time k−1, $e_k'$ is an estimated error for time k, $m_k(i)$ is an estimated mean of i-th level distribution for time k, $m_{k-1}(i)$ is an estimated mean of i-th level distribution for time k−1, and $\mu_m'$ is a third adaptation constant, $$\sigma^2_k(i)$$

is an estimated variance or i-th level distribution for time k, $$\sigma^2_{k-1}(i)$$

is an estimated variance of i-th level distribution for time k−1, and $\mu_v'$ is a fourth adaptation constant. The adaptation constants $\mu_m'$ and $\mu_v'$, in this case, may be much smaller than the adaptation constants $\mu_m$ and $\mu_v$ used during the adaptation phase in Eqs. 9 and 11. For instance, in some embodiments, the adaptation constants $\mu_m'$ and $\mu_v'$ may only have a value of $2^{-9}$ whereas adaptation constants $\mu_m$ and $\mu_v$ may values of $2^{-3}$ and $2^{-4}$, respectively.

In the tracking phase, as represented by block 94, the estimated mean $m_k(i)$ and the estimated variance $$\sigma^2_k(i)$$

for the i-th level distribution may be simultaneously calculated, which is unlike the adaptation phase (e.g., block 92) where the estimated mean $m_k(i)$ is calculated before the estimated variance $$\sigma^2_k(i)$$

is calculated. The estimated means and variances (i.e., standard deviations) computed by the adaptation phase (i.e., blocks 92 and 93) and/or the tracking phase (i.e., block 94) may then be loaded to the other system components such as the computation block 24 of FIG. 3 in order to determine optimal or near optimal means and/or detection threshold at block 95.

In various embodiments, the estimation block 22 and the computation block 24 depicted in FIG. 3 may be implemented using hardware and/or software. For example, the estimation procedures depicted in FIG. 10 may be performed using a processor, a controller, or an application specific integrated circuit (ASIC) executing programming instructions stored in a computer or machine readable medium.

Although specific embodiments have been illustrated and described herein, it will be appreciated by those of ordinary skill in the art and others, that a wide variety of alternate and/or equivalent implementations may be substituted for the specific embodiments illustrated and described without departing from the scope of the present invention. This application is intended to cover any adaptations or variations of the embodiments discussed herein. Therefore, it is manifested and intended that various embodiments of the invention be limited only by the claims and the equivalents thereof.

What is claimed is:

1. An apparatus, comprising:
multi-level memory cells including (i) pilot cells having predetermined data and (ii) multi-level data memory cells to store user data, the multi-level memory cells having M-levels, where M is an integer greater than 1; and
an estimation block configured to compute, for each of M level distributions of the multi-level memory cells, (i) estimated mean and (ii) estimated variance, based at least in part on signal samples associated with the predetermined data of the pilot cells, wherein each of the M level distributions is associated with a corresponding level of the M-levels, and wherein the estimation block is configured to refrain from using signal samples associated with the user data of the multi-level data memory cells to compute (i) the estimated mean and (ii) the estimated variance;
wherein the estimation block is further configured to recompute, for each of the M level distributions of the multi-level memory cells, (i) the estimated mean and (ii) the estimated variance, based at least in part on the signal samples associated with the user data of the multi-level data memory cells, and wherein the estimation block is configured to refrain from using the signal samples associated with the predetermined data of the pilot cells to recompute (i) the estimated mean and (ii) the estimated variance.

2. The apparatus of claim 1, wherein the estimation block is configured to compute the estimated means according to the equations:

$$e_k' = r_k - m_{k-1}(i)$$

$$m_k(i) = m_{k-1}(i) \mu_m \cdot e_k'$$

where for $0 \le i \le M-1$ and k is an integer greater than 0, $r_k$ is a k-th signal sample associated with the predetermined data of one of the pilot cells, $m_{k-1}(i)$ is an estimated mean of i-th level distribution for time k−1, $e_k'$ is an initial estimated error for time k, $m_{k-1}(i)$ is an estimated mean of i-th level distribution for time k−1, and $\mu_m$ is a first adaptation constant.

3. The apparatus of claim 2, wherein the estimation block is configured to compute the estimated variances according to the equations:

$$e_k = r_k - m_k(i)$$

$$\sigma_k^2(i) = \sigma_{k-1}^2(i) + \mu_v(e_k \cdot e_k - \sigma_{k-1}^2(i))$$

where $e_k$ is a refined estimated error for time k based, at least in part, on the initial estimated error $e_k'$, $$\sigma_k^2(i)$$

is an estimated variance of i-th level distribution for time K, $$\sigma_{k-1}^2(i)$$

is an estimated variance of i-th level distribution for time k−1, and $\mu_v$ is a second adaptation constant.

4. The apparatus of claim 1, wherein the estimation block is further configured to set initial mean and initial variance for each of the M level distributions with predetermined default values prior to computing (i) the estimated mean and (ii) the estimated variance for each of the M level distributions.

5. The apparatus of claim 1, wherein the estimation block is further configured to compute M−1 slicer thresholds for the multi-level memory cells, each of the slicer thresholds computed according to the equation:

$$s(w) = m(w) + \frac{\sigma(w)}{\sigma(w) + \sigma(w+1)}[m(w+1) - m(w)]$$

where for $0 \le w \le M-2$, s(w) is an w-th slicer threshold, m(w) is an estimated mean for the w-th level distribution, σ(w) is a standard deviation for the w-th level distribution, σ(w+1) is a standard deviation for the (w+1)-th level distribution, and m(w+1) is an estimated mean for the (w+1)-th level distribution.

6. The apparatus of claim 1, wherein the estimation block is further configured to employ a binary tree to determine to which of the M-levels each of the signal samples of the multi-level memory data cells and the pilot cells belong, the computed slicer thresholds defining, at least in part, the binary tree.

7. The apparatus of claim 3, wherein the estimation block is further configured to recompute the (i) estimated means and (ii) the estimated variances according to the equations:

$$e_k' = r_k' - m_{k-1}(i)$$

$$m_k(i) = m_{k-1}(i) + \mu_m' \cdot e_k'$$

$$\sigma_k^2(i) = \sigma_{k-1}^2(i) + \mu_v'(e_k' \cdot e_k' - \sigma_{k-1}^2(i))$$

where for $0 \le i \le M-1$ and k is an integer greater than 0, $r_k'$ is a k-th signal sample associated with the user data of one of the multi-level data memory cells, $m_{k-1}(i)$ is an estimated mean of i-th level distribution for time k−1, $e_k'$ is an estimated error for time k, $m_k(i)$ is an estimated mean of i-th level distribution for time k, $m_{k-1}(i)$ is an estimated mean of i-th level distribution for time k−1, and $\mu_m'$ is a third adaptation constant, $$\sigma_k^2(i)$$

is an estimated variance of i-th level distribution for time k, $$\sigma_{k-1}^2(i)$$

is an estimated variance of i-th level distribution for time k−1, and $\mu_v'$ is a fourth adaptation constant.

8. The apparatus of claim 7, wherein:

the first adaptation constant $\mu_m$ is greater than the third adaptation constant $\mu_m'$, and the second adaptation constant $\mu_v$ is greater than the fourth adaptation constant $\mu_v'$.

9. The apparatus of claim 1, wherein the estimation block is further configured to:

set initial mean and initial variance for each of the M level distributions with predetermined default values, and compute M−1 initial slicer thresholds for the multi-level memory cells prior to computing (i) the estimated mean and (ii) the estimated variance for each of the M level distributions.

10. The apparatus of claim 9, wherein the estimation block is further configured to compute the initial slicer thresholds in accordance with the equation:

$$s'(w) = m'(w) + \frac{\sigma'(w)}{\sigma'(w) + \sigma'(w+1)}[m'(w+1) - m'(w)]$$

where for $0 \leq w \leq M-2$, s'(w) is an w-th initial slicer threshold, m'(w) is the initial mean for the w-th level distribution, σ'(w) is an initial standard deviation for the w-th level distribution that is equal to square root of the initial variance for the w-th level distribution, σ'(w+1) is an initial standard deviation for the (w+1)-th level distribution that is equal to the square root of the initial variance for the (w+1)-th level distribution, and m'(w+1) is the initial mean for the (w+1)-th level distribution.

11. The apparatus of claim 10, wherein the estimation block is further configured to employ a binary tree to determine to which of the M-levels each of the signal samples of the multi-level memory data cells and the pilot cells belong, the computed initial slicer thresholds defining, at least in part, the binary tree.

12. The apparatus of claim 11, wherein the estimation block is further configured to recompute (i) the estimated means and (ii) the estimated variances of the M level distributions of the multi-level memory cells according to the equations:

$$e_k' = r_k' - m_{k-1}(i)$$
$$m_k(i) = m_{k-1}(i) + \mu_m' \cdot e_k'$$
$$\sigma_k^2(i) = \sigma_{k-1}^2(i) + \mu_v'(e_k' \cdot e_k' - \sigma_{k-1}^2(i))$$

where for $0 \leq i \leq M-1$ and k is an integer greater than 0, $r_k'$ is a k-th signal sample associated with the user data of one of the multi-level data memory cells, $m_{k-1}(i)$ is an estimated mean of i-th level distribution for time k−1, $e_k'$ is an estimated error for time k, $m_k(i)$ is an estimated mean of i-th level distribution for time k, $m_{k-1}(i)$ is an estimated mean of i-th level distribution for time k−1, and $\mu_m'$ is a first adaptation constant, $$\sigma_k^2(i)$$

is an estimated variance of i-th level distribution for time k, $$\sigma_{k-1}^2(i)$$

is an estimated variance of i-th level distribution for time k−1, and $\mu_v'$ is a second adaptation constant.

13. A method, comprising:

receiving signal samples from at least a subset of multi-level memory cells, wherein the multi-level memory cells include (i) pilot cells having predetermined data and (ii) multi-level data memory cells to store user data, the multi-level memory cells having M-levels, where M is an integer greater than 1;

computing (i) estimated means and (ii) estimated variances of level distributions of the multi-level memory cells by processing signal samples associated with the predetermined data of the pilot cells, wherein (i) the estimated means and (ii) the estimated variances are to be used to facilitate writing and/or reading of data to and/or from at least selected ones of the multi-level memory cells, wherein the multi-level memory cells have M-levels, wherein M is an integer greater than 1, and wherein each of the level distributions is associated with a corresponding level of the M-levels; and recomputing (i) the estimated means and (ii) the estimated variances of the level distributions of the multi-level memory cells by processing signal samples associated with the user data of the multi-level data memory cells, wherein computing (i) the estimated means and (ii) the estimated variances further comprises computing (i) the estimated means and (ii) the estimated variances without using the signal samples associated with the user data of the multi-level data memory cells, and wherein recomputing (i) the estimated means and (ii) the estimated variances further comprises recomputing (i) the estimated means and (ii) the estimated variances without using the signal samples associated with the predetermined data of the pilot cells.

14. The method of claim 13, wherein said computing the estimated means include computing estimated mean for each of the level distributions of the multi-level memory cells according to the equations:

$$e_k' = r_k - m_{k-1}(i)$$

$$m_k(i) = m_{k-1}(i) + \mu_m \cdot e_k'$$

where for $0 \leq i \leq M-1$ and k is an integer greater than 0, $r_k$ is a k-th signal sample associated with the predetermined data of one of the pilot cells, $m_{k-1}(i)$ is an estimated mean of i-th level distribution for time k−1, $e_k'$ is an initial estimated error for time k, $m_{k-1}(i)$ is an estimated mean of i-th level distribution for time k−1, and $\mu_m$ is a first adaptation constant.

15. The method of claim 14, wherein said computing the estimated variances includes computing estimated variance for each of the level distributions of the multi-level memory cells according to the equations:

$$e_k = r_k - m(i)$$
$$\sigma_k^2(i) = \sigma_{k-1}^2(i) + \mu_v(e_k \cdot e_k - \sigma_{k-1}^2(i))$$

where $e_k$ is a refined estimated error for time k based, at least in part, on the initial estimated error $e_k'$, $\sigma_k^2(i)$ is an estimated variance of i-th level distribution for time k, $\sigma_{k-1}^2(i)$ is an estimated variance of i-th level distribution for time k−1, and $\mu_v$ is a second adaptation constant.

16. The method of claim 13, further comprising setting initial mean and initial variance for each of the level distributions with predetermined default values prior to computing the estimated means and the estimated variances for each of the level distributions.

17. The method of claim 16, further comprising computing M−1 slicer thresholds for the multi-level memory cells, each of the slicer thresholds computed according to the equation:

$$s(w) = m(w) + \frac{\sigma(w)}{\sigma(w) + \sigma(w+1)}[m(w+1) - m(w)]$$

where for $0 \leq w \leq M-2$, s(w) is an w-th slicer threshold, m(w) is an estimated mean for the w-th level distribution, σ(w) is a standard deviation for the w-th level distribution, σ(w+1) is a standard deviation for the (w+1)-th level distribution, and m(w+1) is an estimated mean for the (w+1)-th level distribution.

18. The method of claim 17, further comprising employing a binary tree to determine to which of the M-levels each of the signal samples of the multi-level memory data cells and the pilot cells belong, the computed slicer thresholds defining, at least in part, the binary tree.

19. The method of claim 18, wherein recomputing (i) the estimated means and (ii) the estimated variances further comprises recomputing (i) the estimated means and (ii) the estimated variances according to the equations:

$$e_k' = r_k' - m_{k-1}(i)$$
$$m_k(i) = m_{k-1}(i) + \mu_m' \cdot e_k'$$
$$\sigma_k^2(i) = \sigma_{k-1}^2(i) + \mu_v'(e_k' \cdot e_k' - \sigma_{k-1}^2(i))$$

where for $0 \leq i \leq M-1$ and k is an integer greater than 0, $r_k'$ is a k-th signal sample associated with the user data of one of the multi-level data memory cells, $m_{k-1}(i)$ is an estimated mean of i-th level distribution for time k−1, $e_k'$ is an estimated error for time k, $m_k(i)$ is an estimated mean of i-th level distribution for time k, $m_{k-1}(i)$ is an estimated mean of i-th level distribution for time k−1, and $\mu_m'$ is a third adaptation constant, $\sigma_k^2(i)$ is an estimated variance of i-th level distribution for time k, $\sigma_{k-1}^2(i)$ is an estimated variance of i-th level distribution for time k−1, and $\mu_v'$ is a fourth adaptation constant.

20. A system, comprising:
multi-level memory cells including (i) pilot cells having predetermined data and (ii) multi-level data memory cells to store user data, the multi-level memory cells having M-levels, where M is an integer greater than 1;
an estimation block configured to compute, for each of M level distributions of the multi-level memory cells, (i) estimated mean and (ii) estimated variance, based at least in part on signal samples associated with the predetermined data of the pilot cells, wherein each of the M level distributions is associated with a corresponding level of the M-levels, wherein the estimation block is further configured to recompute, for each of the M level distributions of the multi-level memory cells, (i) the estimated mean and (ii) the estimated variance, based at least in part on signal samples associated with the user data of the multi-level data memory cells; and
a computation block configured to compute optimal or near optimal (i) mean values and (ii) optimal or near optimal detection threshold values based, at least in part, on the estimated means and the estimated variances of the level distributions of the multi-level memory cells,
wherein
the optimal or near optimal mean values are to be used to facilitate writing of data to the multi-level memory cells,
the optimal or near optimal detection threshold values are to be used to facilitate reading of data from the multi-level memory cells,
the estimation block is configured to refrain from using the signal samples associated with the user data of the multi-level data memory cells to compute (i) the estimated mean and (ii) the estimated variance, and
the estimation block is configured to refrain from using the signal samples associated with the predetermined data of the pilot cells to recompute (i) the estimated mean and (ii) the estimated variance.

* * * * *